(12) United States Patent
Hong

(10) Patent No.: US 8,084,349 B2
(45) Date of Patent: Dec. 27, 2011

(54) METHOD FOR FORMING POST BUMP

(75) Inventor: Dae Jo Hong, Gyeongsangnam-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 12/752,896

(22) Filed: Apr. 1, 2010

(65) Prior Publication Data
US 2011/0111587 A1    May 12, 2011

(30) Foreign Application Priority Data

Nov. 9, 2009  (KR) .................. 10-2009-0107530

(51) Int. Cl.
*H01L 21/44* (2006.01)
(52) U.S. Cl. ............... 438/612; 438/669; 438/672
(58) Field of Classification Search .......... None
See application file for complete search history.

(56) References Cited

U.S. PATENT DOCUMENTS

| | | | |
|---|---|---|---|
| 5,411,918 A * | 5/1995 | Keible et al. .......... | 257/737 |
| 6,547,124 B2 * | 4/2003 | Shah et al. .......... | 228/246 |
| 6,630,742 B2 * | 10/2003 | Sakuyama .......... | 257/772 |
| 6,706,554 B2 * | 3/2004 | Ogura .......... | 438/106 |
| 6,723,630 B2 * | 4/2004 | Tong et al. .......... | 438/613 |
| 6,784,087 B2 * | 8/2004 | Lee et al. .......... | 438/612 |
| 6,861,346 B2 * | 3/2005 | Tong et al. .......... | 438/613 |
| 7,670,874 B2 * | 3/2010 | Trezza .......... | 438/106 |
| 7,892,962 B2 * | 2/2011 | Su .......... | 438/612 |
| 2004/0082161 A1 * | 4/2004 | Ho et al. .......... | 438/614 |
| 2006/0087034 A1 * | 4/2006 | Huang et al. .......... | 257/737 |

FOREIGN PATENT DOCUMENTS

JP    05-166815 A    7/1993

* cited by examiner

*Primary Examiner* — Scott B Geyer
(74) *Attorney, Agent, or Firm* — Lowe, Hauptman, Ham & Berner, LLP

(57) ABSTRACT

Disclosed is a method for forming post bumps, the method including the steps of: forming a seed layer for metal plating on a substrate; forming a resist layer having openings provided as positions where the seed layer is subjected to metal plating; forming a dummy sheet, exposing the openings, on the resist layer; forming a post by performing metal plating of the openings; forming solder balls on the post; and removing the dummy sheet and the resist layer.

19 Claims, 2 Drawing Sheets

[FIG. 1A]
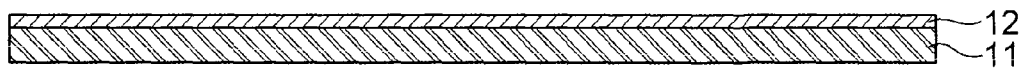
[FIG. 1B]
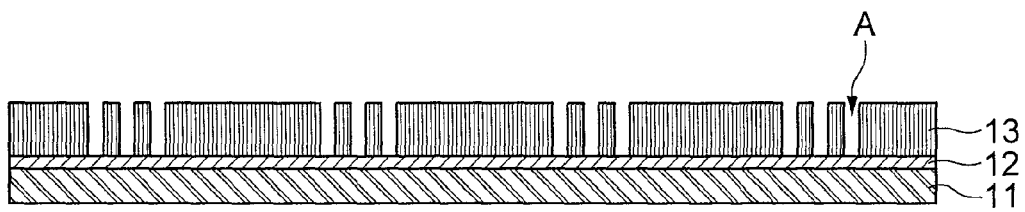
[FIG. 1C]
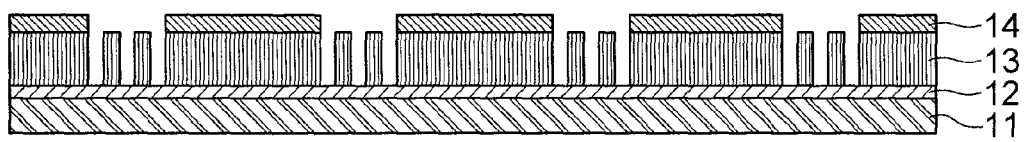
[FIG. 1D]
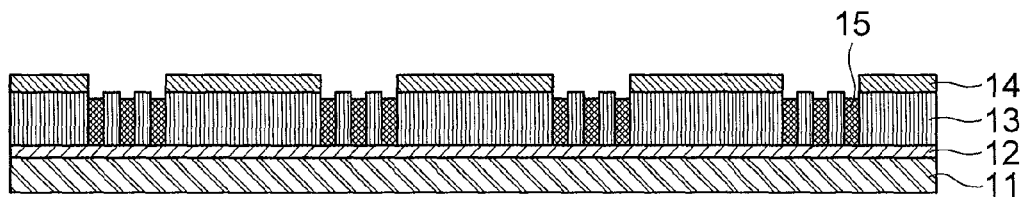
[FIG. 1E]
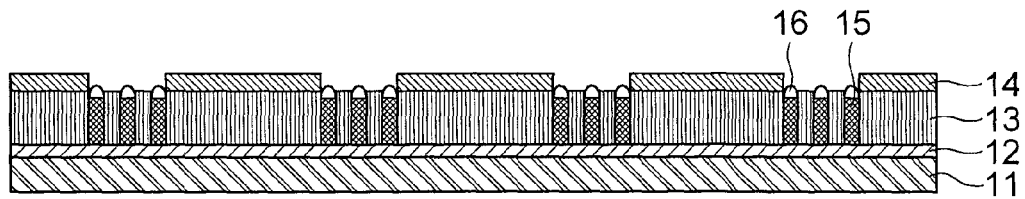
[FIG. 1F]
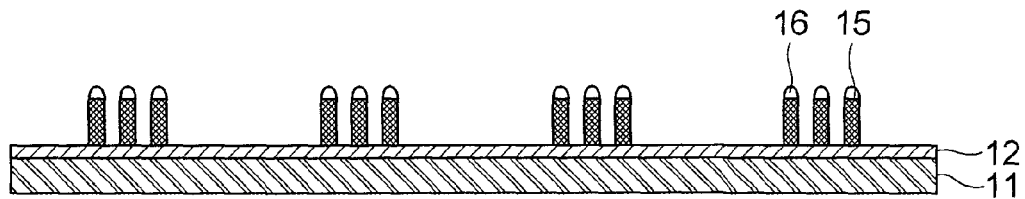

[FIG. 2]
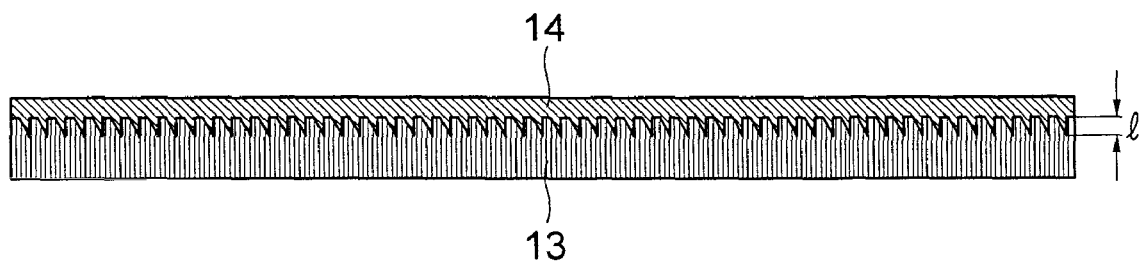

METHOD FOR FORMING POST BUMP

CROSS-REFERENCE TO RELATED APPLICATIONS

This application claims the benefit of Korean Patent Application No. 10-2009-0107530 filed with the Korea Intellectual Property Office on Nov. 9, 2009, the disclosure of which is incorporated herein by reference.

BACKGROUND OF THE INVENTION

1. Field of the Invention

The present invention relates to a method for forming post bumps; and, more particularly, to a method for forming post bumps in which metal post is formed, and a solder ball is formed on the metal post.

2. Description of the Related Art

A packaging technology of integrated circuits is being continuously developed to satisfy the requirement of miniaturization and reliable mounting in semiconductor industries.

For example, the requirement of miniaturization brings out mounting development of the packaging technology in which integrated circuits are manufactured to become as small as a chip. Moreover, the requirement of reliable mounting gives much interest on a packaging technology which can improve mechanical and electrical reliability after mounting, and efficiency of mounting work.

As for a typical example of the package miniaturization, a Ball Grid Array (hereinafter, referred to as 'BGA') may be exemplified. The size of the entire BGA package is the same as that of a semiconductor chip, or is almost similar to that of a semiconductor chip.

In particular, a BGA uses a solder ball to mount electronic devices on a Printed Circuit Board (PCB), so it is possible to remarkably reduce mounting area.

With the recent trend toward high integration of semiconductor chips, there has been much use of Fine Pitch Ball Grid Array (FBGA) package in which fine pitches between signal/power input/output pins are made and mounting area is reduced while electrical connection to an external circuit is achievable by a solder ball.

In addition, there has been developed a post bump formation scheme for using copper electroplating instead of a solder paste or a solder ball, in order to make a bump with a finer pitch than is made by a solder bump formation scheme.

When a post bump is formed by using copper plating, it is necessary to form posts with the same height in copper electroplating. In order to form the posts with the same height, it is necessary to reduce plating variation. However, since plated-region is very small and plated-portion is concentrated on a central portion of a product, currents are concentrated in a plating process, which results in non-uniformity of post bump's height and plating variation.

SUMMARY OF THE INVENTION

The present invention has been proposed in order to overcome the above-described problems and it is, therefore, an object of the present invention to provide a method for forming post bumps at the same height by additionally forming a dummy sheet on a resist layer.

In accordance with another aspect of the present invention to achieve the object, there is provided a method for forming post bumps including the steps of: forming a seed layer for metal plating on a substrate; forming a resist layer having openings provided as positions where the seed layer is subjected to metal plating; forming a dummy sheet, exposing the openings, on the resist layer; forming a post by performing metal plating of the openings; forming solder balls on the post; and sequentially removing the dummy sheet and the resist layer.

Also, the step of forming the resist layer includes the steps of: layering a photosensitive film layer on the seed layer; and selectively exposing and developing the photosensitive film layer so that regions corresponding to the metal plating positions can be opened, partially removing the regions to thereby forming the openings.

Also, the step of sequentially removing the dummy sheet and the resist layer includes the steps of: removing the dummy sheet by using a vacuum pad; and removing the photosensitive film layer remaining on the substrate.

Also, the photosensitive film layer is formed of a dry film with heat-resistance.

Also, the step of forming a post by performing metal plating of the openings includes a step of performing electroplating by using the seed layer as an electrode.

Also, the step of forming the solder balls on the post includes a step of performing squeezing of the solder paste and forcedly inserting the solder paste in a part of the remaining openings after plating the solder paste on the post.

Also, in the step of forming the solder balls on the post, the solder balls are formed in a dome shape where space partitioned by virtual lines extending toward an axial direction of the post from an outer circumference of the post is filled.

Also, the substrate is formed of at least one of a circuit substrate, a semiconductor wafer, and an electronic device.

Also, the metal or the solder is formed of at least one of a Sn—Pb based solder, a Sn—Ag based solder, and a Sn—Ag—Cu based solder.

Also, the method further includes a step of removing the seed layer exposed to an outside, after step of sequentially removing the dummy sheet and the resist layer.

Also, a surface where the dummy sheet is bonded on the resist layer is formed in a convex/concave shape.

Also, the convex/concave is formed to have a size of 10 micrometer or lower.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 1A to 1F are views showing processes for forming post bumps in accordance with an embodiment of the present invention, respectively; and FIG. 2 is a cross-sectional view showing an example where a dummy sheet is bonded on a resist layer in accordance with an embodiment of the present invention.

DETAILED DESCRIPTION OF THE PREFERABLE EMBODIMENTS

Embodiments of a method for forming post bumps in accordance with the present invention will be described in detail with reference to the accompanying drawings. When describing them with reference to the drawings, the same or corresponding component is represented by the same reference numeral and repeated description thereof will be omitted.

FIGS. 1A to 1F are views showing processes of forming post bumps in accordance with an embodiment of the present invention, respectively.

As shown in FIGS. 1A to 1F, in a method for forming post bumps in accordance with the embodiment of the present invention, a seed layer 12 for metal plating is formed on a substrate 11, and a resist layer 13 having openings A provided as positions where the seed layer 12 is subjected to metal plating is formed.

Thereafter, a dummy sheet 14 for exposing the openings A is formed on the resist layer 13, and the openings A are subjected to metal plating to thereby form the post 15, and after solder balls 16 are formed on the post 15, the dummy sheet and the resist layer are removed.

First, as shown in FIG. 1A, the seed layer 12 may be formed on the substrate 11 through deposition of conductive materials for metal plating.

Herein, the substrate refers to a plat-like base material, and may be formed of at least one of an electronic device, a circuit substrate, and a semiconductor wafer. The seed layer 12 may play a role of an electrode during a subsequent process, i.e., electro plating.

As shown in FIG. 1B, in a method for forming the resist layer 13 having the openings A provided as positions where the seed layer 120 is subjected to metal plating, a photosensitive film layer is layered on the seed layer 12, the photosensitive film layer is selectively exposed and developed so that regions corresponding to metal plating positions can be opened, and then a partial region is removed to thereby form the openings A. Therefore, in such a manner, it is possible to form the resist layer 13 having the openings A provided as positions where the seed layer 120 is subjected to metal plating.

The resist layer 13 having the openings A formed therein may be formed in various manners except for the above-described method.

A dry film having heat-resistance or liquid photosensitivity materials for exposing the photoresist by Ultra Violet (UV) rays may be used as the photosensitive film layer. The dry film comes to be closely adhered on the seed layer 12 by using a laminator, and liquid photosensitivity materials are coated and dried on the seed layer 12 to thereby form the photosensitive film layer.

When UV rays are irradiated on the photosensitive film layer, the photosensitive film layer remaining except for light blocked regions is exposed. In this case, the exposed regions are cured by polymerization reaction, while the light blocked regions are unchanged.

As shown in FIG. 1C, in a method for forming the dummy sheet 14, which exposes the openings A, on the resist layer 13, the dummy sheet 14 with the convex/concave is layered on the resist layer 13, the dummy sheet 14 is forcedly adhered and bonded on the resist layer 13.

The bonding surface between the dummy sheet 14 and the resist layer 13 may be formed to have a metal thin film with the convex/concave structure. It is desirable that the width (I) of the convex/concave is formed to have a size of 10 micrometer or lower, for bonding in force (refer to FIG. 2).

As shown in FIG. 1D, a bottom surface of the openings A is filled with a metallic material to thereby form the post 15. As shown in FIG. 1E, solder balls 16 are formed on the post 15.

In a method for forming the solder balls 16 on the post 15, a solder paste is coated on the post 15, and then the solder paste is subjected to squeezing and is forcedly inserted into a part of the remaining openings A. Alternatively, a solder ball may be formed in a dome shape where space partitioned by virtual lines extending toward an axis direction from an outer circumference of the post 15 is filled.

Herein, a metal or a solder ball may be formed by at least one of a Sn—Pb based solder, a Sn—Ag based solder, and a Sn—Ag—Cu based solder.

As shown in FIG. 1F, in a method for sequentially removing the dummy sheet 14 and the resist layer, the dummy sheet 14 is removed by using a vacuum pad, and the photosensitive film layer remaining on the seed layer 12 is removed.

Finally, the seed layer 12 exposed to outside of the substrate 11 is removed.

In a conventional method for forming post bumps, the resist layer 13 having the openings A formed therein is formed, and then copper plating is performed without layering the dummy sheet.

Therefore, since currents are concentrated on a predetermined region of the resist layer 13, a shape of the post 15 formed on Cu-excessive-plating region is different from a shape of the post 15 formed on Cu-uniform-plating region. Herein, the term Cu-excessive-plating means that Cu is excessively plated and the term Cu-uniform-plating means that Cu is uniformly plated compared with the Cu-excessive-plating region.

In order to solve such a problem, by a method for forming post bumps in accordance with an embodiment of the present invention, it is possible to uniformly distribute currents in a plating process by bonding the dummy sheet 14 on the resist layer 13.

In the method for forming a post bump in accordance with an embodiment of the present invention, the seed layer 12 serves as an anode and a part for providing copper Cu serves as a cathode in a process of performing copper plating of the openings A.

When inside of the openings A is subjected to copper plating after the resist layer 13 alone is formed, currents fail to be uniformly distributed on the resist layer 13, so posts formed within the openings A are formed to have the uniform size (e.g., the same height).

However, when inside of the openings A is subjected to copper plating after the dummy sheet 14 is bonded on the resist layer 13, currents are uniformly distributed on all surfaces of the dummy sheet 14 having the metal thin film formed thereon, so the posts formed within the openings A are formed to have the uniform size.

In accordance with an embodiment of the present invention, it is possible to additionally form a dummy sheet to thereby distribute currents to be concentrated on the dummy sheet in a plating process, thereby forming post bumps with the same height.

Also, one surface of the dummy sheet adjacent to the resist layer is formed to be in a convex/concave shape, and is forcedly bonded on the resist layer, so that it is possible to separate the dummy sheet through a vacuum pad after formation of the post bumps, and to delaminate and dry copper used for plating in etching lines of the separated dummy sheet to thereby provide reuse effect.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:
1. A method of forming a post bumps, comprising:
 forming a seed layer for metal plating over a substrate;

forming a resist layer having openings provided as positions where the seed layer is subjected to the metal plating, the formation of the resist layer comprising:
  layering a photosensitive film layer on the seed layer; and
  selectively exposing and developing the photosensitive film layer so that regions corresponding to the metal plating positions can be opened, and partially removing the regions to thereby forming the openings;
forming a dummy sheet, exposing the openings, on the resist layer;
forming a post by performing the metal plating of the openings;
forming solder balls on the post; and
sequentially removing the dummy sheet and the resist layer, the sequential removal comprising:
  removing the dummy sheet by using a vacuum pad; and
  removing the photosensitive film layer remaining on the substrate.

2. The method of claim 1, wherein the forming a post by performing metal plating of the openings comprises performing electroplating by using the seed layer as an electrode.

3. The method of claim 1, wherein the substrate is formed of at least one of a circuit substrate, a semiconductor wafer, and an electronic device.

4. The method of claim 1, wherein the metal or the solder comprises a Sn—Ag based solder or a Sn—Ag—Cu based solder.

5. The method of claim 1, further comprising removing the seed layer exposed to an outside, after the sequentially removing the dummy sheet and the resist layer.

6. The method of claim 1, wherein the metal or the solder comprises a Sn—Pb based solder.

7. A method of forming a post bumps, comprising:
forming a seed layer for metal plating over a substrate;
forming a resist layer having openings provided as positions where the seed layer is subjected to the metal plating, the formation of the resist layer comprising:
  layering a photosensitive film layer on the seed layer; and
  selectively exposing and developing the photosensitive film layer so that regions corresponding to the metal plating positions can be opened, and partially removing the regions to thereby forming the openings;
forming a dummy sheet, exposing the openings, on the resist layer;
forming a post by performing the metal plating of the openings;
forming solder balls on the post; and
sequentially removing the dummy sheet and the resist layer,
wherein the photosensitive film layer is formed of a dry film with heat-resistance.

8. The method of claim 7, wherein the metal or the solder comprises a Sn—Ag based solder or a Sn—Ag—Cu based solder.

9. The method of claim 7, wherein the metal or the solder comprises a Sn—Pb based solder.

10. A method of forming a post bumps, comprising:
forming a seed layer for metal plating over a substrate;
forming a resist layer having openings provided as positions where the seed layer is subjected to the metal plating:
forming a dummy sheet, exposing the openings, on the resist layer;
forming a post by performing the metal plating of the openings;
forming solder balls on the post; and
sequentially removing the dummy sheet and the resist layer,
wherein the formation of the solder balls on the post comprises performing squeezing of a solder paste and forcedly inserting the solder paste in a part of the remaining openings after plating the solder paste on the post.

11. The method of claim 10, wherein the metal or the solder comprises a Sn—Ag based solder or a Sn—Ag—Cu based solder.

12. The method of claim 10, wherein the metal or the solder comprises a Sn—Pb based solder.

13. A method of forming a post bumps, comprising:
forming a seed layer for metal plating over a substrate;
forming a resist layer having openings provided as positions where the seed layer is subjected to the metal plating:
forming a dummy sheet, exposing the openings, on the resist layer;
forming a post by performing the metal plating of the openings;
forming solder balls on the post; and
sequentially removing the dummy sheet and the resist layer,
wherein the formation of the solder balls on the post, the solder balls are formed in a dome shape where space partitioned by virtual lines extending toward an axial direction of the post from an outer circumference of the post is filled.

14. The method of claim 13, wherein the metal or the solder comprises a Sn—Ag based solder or a Sn—Ag—Cu based solder.

15. The method of claim 13, wherein the metal or the solder comprises a Sn—Pb based solder.

16. A method of forming a post bumps, comprising:
forming a seed layer for metal plating over a substrate;
forming a resist layer having openings provided as positions where the seed layer is subjected to the metal plating:
forming a dummy sheet, exposing the openings, on the resist layer;
forming a post by performing the metal plating of the openings;
forming solder balls on the post; and
sequentially removing the dummy sheet and the resist layer,
wherein a surface where the dummy sheet is bonded on the resist layer is formed in a convex/concave shape.

17. The method of claim 16, wherein the convex/concave is formed to have a size of 10 micrometer or lower.

18. The method of claim 16, wherein the metal or the solder comprises a Sn—Ag based solder or a Sn—Ag—Cu based solder.

19. The method of claim 16, wherein the metal or the solder comprises a Sn—Pb based solder.

* * * * *